(12) United States Patent
Hida et al.

(10) Patent No.: US 11,250,979 B2
(45) Date of Patent: Feb. 15, 2022

(54) PERMANENT MAGNET COMPRISING AN ANTIFERROMAGNETIC LAYER AND A FERROMAGNETIC LAYER

(71) Applicant: COMMISSARIAT A L'ENERGIE ATOMIQUE ET AUX ENERGIES ALTERNATIVES, Paris (FR)

(72) Inventors: Rachid Hida, Cras (FR); Bertrand Delaet, Bernin (FR); Sophie Giroud, Saint-Egreve (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 91 days.

(21) Appl. No.: 16/762,004

(22) PCT Filed: Sep. 25, 2018

(86) PCT No.: PCT/FR2018/052354
§ 371 (c)(1),
(2) Date: May 6, 2020

(87) PCT Pub. No.: WO2019/092333
PCT Pub. Date: May 16, 2019

(65) Prior Publication Data
US 2020/0265984 A1    Aug. 20, 2020

(30) Foreign Application Priority Data
Nov. 10, 2017 (FR) ...................................... 1760619

(51) Int. Cl.
*G01R 33/02* (2006.01)
*H01F 10/32* (2006.01)
(Continued)

(52) U.S. Cl.
CPC ....... *H01F 10/3218* (2013.01); *G01R 15/207* (2013.01); *G01R 19/0092* (2013.01);
(Continued)

(58) Field of Classification Search
CPC ........ G01R 33/02; G01R 33/07; G01R 33/09; G01R 19/0092; G01R 15/207;
(Continued)

(56) References Cited

U.S. PATENT DOCUMENTS

2003/0090831 A1* 5/2003 Doerner ................. B82Y 25/00
                                                             360/97.11
2004/0165321 A1* 8/2004 Hasegawa ........... H01F 10/3272
                                                             360/324.11
(Continued)

FOREIGN PATENT DOCUMENTS

DE  10 2007 032 299 A1  1/2009
EP   3 229 036 A1       10/2017
(Continued)

OTHER PUBLICATIONS

Groudeva-Zotova, S. et al., "Magnetic and structural characteristics of exchange biasing systems based on NiMn antiferromagnetic films," Journal of Magnetism and Magnetic Materials, 2003, vol. 263, pp. 57-71.
(Continued)

*Primary Examiner* — Raul J Rios Russo
(74) *Attorney, Agent, or Firm* — Oblon, McClelland, Maier & Neustadt, L.L.P.

(57) ABSTRACT

A permanent magnet comprising an antiferromagnetic layer and a ferromagnetic layer having a first sub-layer made of a first type of ferromagnetic material, the first type of ferromagnetic material being an at least partially crystallized alloy of iron and cobalt, and a second sub-layer made of a second type of ferromagnetic material, this second type of
(Continued)

ferromagnetic material also being an alloy of iron and cobalt in which the proportion of face-centered cubic crystals is less than the proportion of face-centered cubic crystals in the first type of ferromagnetic material.

13 Claims, 2 Drawing Sheets

(51) Int. Cl.
    *G01R 33/028*     (2006.01)
    *H01F 7/02*     (2006.01)
    *H01F 41/30*     (2006.01)
    *G01R 33/07*     (2006.01)
    *G01R 33/09*     (2006.01)
    *G01R 19/00*     (2006.01)
    *G01R 15/20*     (2006.01)
    *G01R 33/06*     (2006.01)
    *G01R 33/00*     (2006.01)

(52) U.S. Cl.
    CPC ........... *G01R 33/02* (2013.01); *G01R 33/028* (2013.01); *G01R 33/06* (2013.01); *G01R 33/07* (2013.01); *G01R 33/09* (2013.01); *H01F 7/0294* (2013.01); *H01F 41/302* (2013.01); *G01R 33/0023* (2013.01); *G01R 33/093* (2013.01)

(58) Field of Classification Search
    CPC .. G01R 33/06; G01R 33/0023; G01R 33/093; G01R 33/028; H01F 10/3218; H01F 7/0294; H01F 41/302; H01F 41/30
    USPC ................... 324/51, 55, 200, 227, 228, 244
    See application file for complete search history.

(56) References Cited

U.S. PATENT DOCUMENTS

| | | |
|---|---|---|
| 2007/0159164 A1 | 7/2007 | Hehn et al. |
| 2008/0218913 A1* | 9/2008 | Nishimura ........... G11B 5/3929 360/324.2 |
| 2008/0241597 A1 | 10/2008 | Dieny et al. |
| 2009/0289747 A1 | 11/2009 | Duraffourg et al. |
| 2011/0151589 A1 | 6/2011 | Redon |
| 2011/0304325 A1 | 12/2011 | Walther et al. |
| 2017/0053724 A1 | 2/2017 | Delaet et al. |
| 2017/0294253 A1 | 10/2017 | Delaet et al. |

FOREIGN PATENT DOCUMENTS

| | | |
|---|---|---|
| FR | 2 852 400 A1 | 9/2004 |
| FR | 3 020 497 A1 | 10/2015 |
| WO | WO 2010/084165 A1 | 7/2010 |

OTHER PUBLICATIONS

International Search Report dated Jan. 18, 2019 in PCT/FR2018/052354 filed on Sep. 25, 2018 citing documents AA-AC and AO-AR therein, 2 pages.

* cited by examiner

PERMANENT MAGNET COMPRISING AN ANTIFERROMAGNETIC LAYER AND A FERROMAGNETIC LAYER

The invention relates to a permanent magnet and to a magnetic-field sensor incorporating this permanent magnet. The invention also relates to a process for manufacturing this permanent magnet.

Known magnetic-field sensors incorporate permanent magnets in order to measure the amplitude, in a given direction, of a magnetic field to be measured. Such sensors are described, for example, with reference to FIG. 4 of patent application US2011/0151589 or with reference to FIGS. 1A to 8 of patent application WO2010/0084165. Other sensors are described in patent application US2017053724A1.

The permanent magnets used in these sensors, contrary to the pinned layers used in spin or GMR (giant magnetoresistance) valves and in tunnel or TMR (tunnel magnetoresistance) junctions, must generate a strong magnetic field. It will be recalled that, in spin valves and tunnel junctions, the magnetic field generated by the pinned layer must in contrast be weak to allow the magnetization direction of the free layer to turn and align with the direction of an exterior magnetic field. Thus, in the case of dynamic structures, such as MRAM structures (MRAM being the acronym of magnetoresistive random access memory) for example, the magnetization changes during the use of the structure. In contrast, in permanent magnets, the magnetization direction is set.

To obtain a strong magnetic field, in known sensors the permanent magnet is formed by a stack of ferromagnetic layers and of antiferromagnetic layers. For example, such a known permanent magnet may comprise:
an antiferromagnetic layer,
a ferromagnetic layer, the magnetization direction of the ferromagnetic layer being set by exchange coupling to the antiferromagnetic layer, this ferromagnetic layer comprising:
  a first sublayer making contact with the antiferromagnetic layer or solely separated from the antiferromagnetic layer by an intermediate ferromagnetic sublayer the thickness of which is smaller than 2 nm, the thickness of this first sublayer being larger than 2 nm, this first sublayer being made of a first type of ferromagnetic material, the first type of ferromagnetic material being an alloy of iron and of cobalt that is at least partially crystallized, and
  a second sublayer separated from the antiferromagnetic layer by the first sublayer, the thickness of this second sublayer being larger than 2 nm, this second sublayer being made of a second type of ferromagnetic material.

Such a known permanent magnet is described in patent application EP3229036. In patent application EP3229036, the second sublayer is an alloy of iron, of cobalt and of boron so as to improve the insensitivity of this magnet to exterior magnetic perturbations. The magnetization of such a permanent magnet typically has a hysteresis cycle such as that shown in FIG. 1 of patent application EP3229036.

Known permanent magnets are sensitive to heat treatments and, in particular, to heat treatments involving high temperatures. Here, by high temperature, what is meant is a temperature higher than 200° C. and, typically, higher than 300° C. or 400° C.

The permanent magnet is subjected to such heat treatments notably during certain phases of its manufacture. For example, it is not rare for such a magnet to be exposed to heat treatments involving temperatures higher than 400° C. during the production of the encapsulation layer that will mechanically and chemically isolate it from the exterior environment.

The sensitivity of the permanent magnet to heat treatments may be seen in a definitive modification of its magnetic properties and, in particular, of the shape and/or position of its hysteresis cycle. More precisely, following a heat treatment at a high temperature, a decrease in the ratio $H_{ex}/H_c$ is generally observed. The fields $H_c$ and $H_{ex}$ are defined below. Generally, at high temperatures, this decrease in the ratio $H_{ex}/H_c$ is substantial. Typically, this decrease is substantial when, amplitudewise, it corresponds to a variation of at least 10% or 30% in its initial value, i.e. in its value before the application of the heat treatment.

It is desirable to decrease this sensitivity of permanent magnets to heat treatments or, in other words, to increase the thermal stability of these permanent magnets.

The invention aims to satisfy this desire. To this end, one subject of the invention is a permanent magnet as claimed in claim 1.

Embodiments of this permanent magnet may comprise one or more of the features of the dependent claims.

Another subject of the invention is a magnetic-field sensor comprising the claimed magnet.

Lastly, another subject of the invention is a process for manufacturing the claimed permanent magnet.

The invention will be better understood on reading the following description, which is given merely by way of nonlimiting example, with reference to the appended drawings, in which.

SECTION I: NOTATIONS AND DEFINITIONS

In these figures, the same references have been used to designate the elements that are the same. In the rest of this description, features and functions well known to those skilled in the art are not described in detail.

In this description, unless otherwise indicated, the proportions are indicated in "atomic percent" and noted "at %" or simply "%".

In this description, when it is indicated that a layer or a sublayer is "made of X" or when an "X layer" or a "layer of X" or a "layer made of X" is spoken of, what is meant is a layer or a sublayer in which the proportion of the material X represents more than 95%, and generally more than 98% or 99%.

By "alloy of iron and of cobalt", what is meant is an alloy in which the proportion of iron and of cobalt is higher than 95% or 95% or 99%.

By "alloy of iron and of nickel", what is meant is an alloy in which the proportion of iron and of nickel is higher than 95% or 95% or 99%.

The composition of a layer or of a sublayer is noted in the following way: $A_xB_y$, where:
A and B are the symbols of the chemical elements from which this layer or sublayer is composed, and
the index x is the proportion of the element A in the layer or sublayer, and
the index y is the proportion of the element B in the layer or sublayer.

Below, by "permanent magnet" what is meant is a permanent magnet the magnetic field of which is strong. The magnetic field of a permanent magnet comprising a stack of ferromagnetic and antiferromagnetic layers is considered to be strong if the total magnetic moment of this magnet per unit area is higher than $50 \times 10^{-3}$ A and, preferably, higher than $500 \times 10^{-3}$ A or $1000 \times 10^{-3}$ A. The method for measuring this total magnetic moment is for example that described in patent application EP3229036.

The terms "exchange field $H_{ex}$" or "field $H_{ex}$", "coercive field $H_c$" or "field $H_c$" and "field H*" have already been defined in patent application EP3229036. The definition of these terms given with reference to FIG. 1 of patent application EP3229036 is used here.

The field $B_R$ of the permanent magnet corresponds to the magnetization at zero field.

The term "squareness" designates a value that increases as the hysteresis cycle of the permanent magnet becomes more rectangular. This value is for example calculated using the following formula: squareness=$(1-(B_R/(SlopeAtH_c*H_c)))$, where $SlopeAtH_c$ is the slope of the curve of the magnetization B as a function of the field H at a point of abscissa $H_{ex}-H_c$. The reader is also referred to the definition of this term in patent application EP3229036.

SECTION II: EXAMPLES OF EMBODIMENTS

Figure 1:
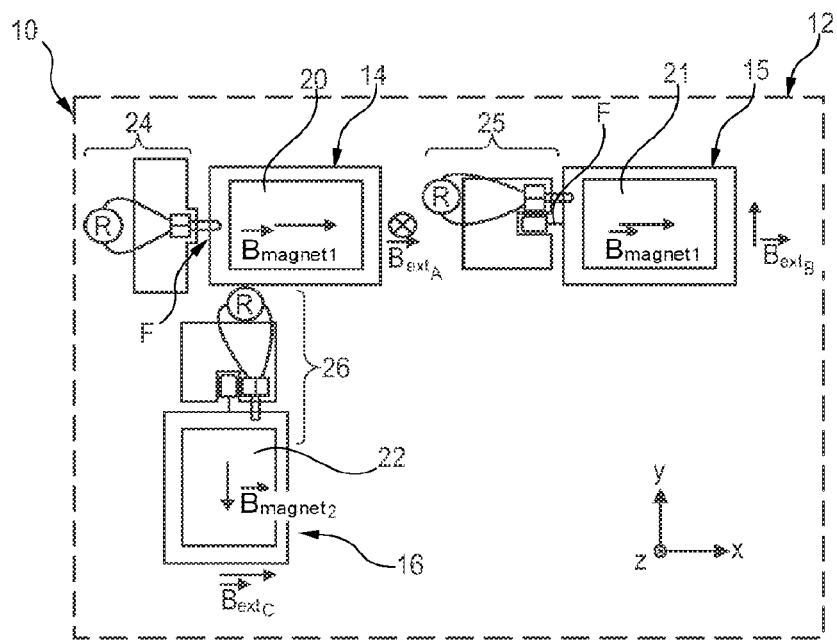
FIG. 1 is a schematic illustration, seen from above, of a magnetic-field sensor.

FIG. 1 shows a magnetic-field sensor 10. This sensor 10 is identical to the sensor described with reference to FIG. 8 of patent application US2017053724A1, except as regards the structure of the permanent magnets used. Thus, only a brief description of the general architecture of this sensor is given to illustrate an example of an embodiment of such a sensor.

This sensor 10 comprises:
a substrate 12 lying essentially in a horizontal plane parallel to orthogonal directions X and Y, and
three single-axis magnetometers 14 to 16 produced on the substrate 12.

A direction Z, perpendicular to the directions X and Y, represents the vertical. Below, the following figures are oriented with respect to the same system of axes X, Y, Z. In addition, terms such as "above", "below", "bottom" and "top" are defined with respect to this direction Z.

Magnetometers 14 to 16 measure the amplitude of the magnetic field to be measured in the directions Z, Y and X, respectively. To this end, each magnetometer 14 to 16 comprises:
a permanent magnet, 20 to 22, respectively, able to move with respect to the substrate 12, and
a transducer, 24 to 26, respectively, able to convert the movement of the permanent magnet into a corresponding variation in current or voltage.

For example, the transducers 24 to 26 are piezoresistive transducers. Typically, these transducers are fastened, with no degree of freedom, on the one hand to the substrate 12 and, on the other hand, to the permanent magnet.

Here, the permanent magnets 20 to 22 are identical with the exception of the fact that the direction of the overall magnetic moment of the permanent magnet 22 is perpendicular to that of the permanent magnets 20 and 21. Thus, only a detailed description of the permanent magnet 20 is given below.

Figure 2:
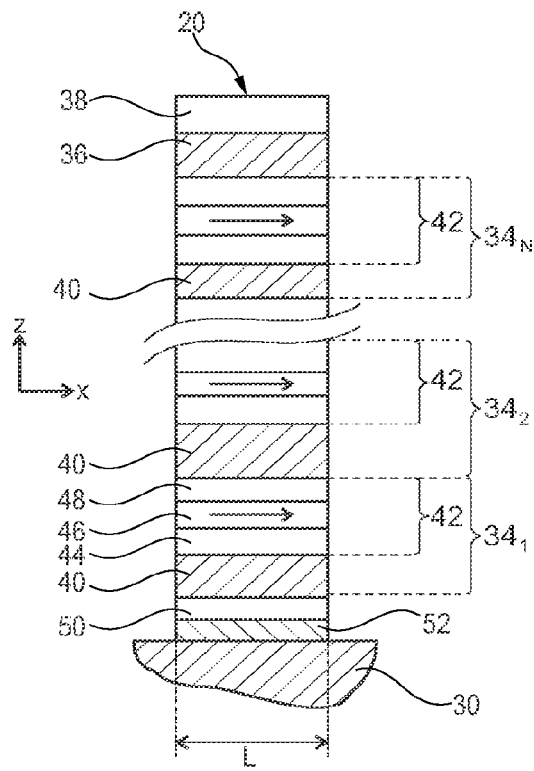
FIG. 2 is a schematic illustration, in longitudinal vertical cross section, of a permanent magnet of the sensor of FIG. 2.

FIG. 2 shows the permanent magnet 20 deposited on a plinth 30 that is movable with respect to the substrate 12. For example, the plinth 30 is obtained by etching the substrate 12. Only one portion of this plinth 30 is shown in FIG. 2.

The magnet 20 is formed from a stack, in a stacking direction, of ferromagnetic and antiferromagnetic layers. Here the stacking direction is parallel to the direction Z. In FIG. 2 and the following figures, the following conventions have been adopted:
the antiferromagnetic layers have been hatched,
the direction of the magnetic moment of a ferromagnetic layer has been represented by an arrow,
the wavy lines in the middle of the stack indicate that an intermediate segment of this stack has not been shown,
the proportions between the thicknesses of the various layers have not been respected to improve the legibility of the figures, and
the proportion between the length L and the height of the stack has not been respected to decrease the size of the figures in the longitudinal direction of the stack.

Here, the stack has a parallelepipedal shape and an aspect ratio higher than or equal to 2, 5 or 20, or even higher than 100 or 1000. In this embodiment, the aspect ratio is defined as being the ratio of the length L to the width W of the stack. Here, the length is parallel to the direction X and the width W is parallel to the direction Y.

The higher the aspect ratio the easier it is to align the magnetization direction of the ferromagnetic layers with the longitudinal direction of the stack. For example, the width of the stack is smaller than 20 Å m or 10 Å m and the length L is larger than 50 Å m or 100 Å m or 1 mm. The height of the stack is generally larger than 100 Å m or 500 Å m. This height is measured between the layer of the stack closest to the plinth 30 and the layer of the same stack furthest from the plinth 30.

Here, the stack of ferromagnetic and antiferromagnetic layers is composed in succession in the direction Z:
of a pattern 34 repeated N times, then
of an antiferromagnetic layer 36 then, typically,
of an encapsulation layer 38 deposited on the top of this stack.

The layer 38 is intended to protect the permanent magnet from the chemical and/or physical aggressions of the exterior environment. This layer 38 is made of a non-magnetic material. By non-magnetic material, what is meant here is a material devoid of magnetic properties capable of disrupting the operation of the permanent magnet 20. Generally, it is a question of a material that has no magnetic properties or magnetic properties that are immeasurable.

Typically, the layer 38 is made of tantalum (Ta) or molybdenum (Mo) or ruthenium (Ru) or a combination of these materials. For example, the layer 38 is made of tantalum (Ta) and its thickness is larger than or equal to 10 nm.

The layer 36 is an antiferromagnetic layer. It is for example identical to the layer 40 described below.

The first occurrence of the pattern 34 in the stack, i.e. the occurrence that is closest to the plinth 30, is referenced $34_1$, the second occurrence immediately above this first occurrence $34_1$ is referenced $34_2$ and so on up to the occurrence $34_N$.

Here, the occurrences $34_1$ to $34_N$ are stacked directly on one another and are therefore not separated from one another by any other layer not belonging to the pattern 34.

The number N of repetitions of the pattern 34 is generally chosen to reach a height desired for the stack. This height depends on the envisioned application. N is higher than or equal to 2 and, preferably, higher than 5 or 10 or 20. N is also generally lower than 50 or 100. Here, N is also chosen so as to achieve the magnetic moment per unit area sought for the permanent magnet.

In this embodiment, the various occurrences of the pattern 34 are all identical to one another and therefore only the occurrence $34_1$ will be described in detail.

The occurrence $34_1$ is composed in succession in the direction Z:
of an antiferromagnetic layer 40, and
of a ferromagnetic layer 42 the magnetization direction of which is pinned by exchange coupling to the antiferromagnetic layer 40.

In this patent application, by "antiferromagnetic" layer what is meant is a horizontal layer of constant thickness in which the proportion of antiferromagnetic materials is higher than 95% or 98% or 99%. For example, the antiferromagnetic materials used are chosen from the group composed:
of alloys of manganese, and
of NiO, and
of $Fe_2O_3$.

The antiferromagnetic alloys of manganese are typically PtMn, NiMn, PdPtMn, FeMn and IrMn. In this example, the antiferromagnetic material chosen for the layer 40 is the alloy PtMn.

In this patent application, by "ferromagnetic" layer what is meant is a horizontal layer of constant thickness in which the proportion of ferromagnetic materials is higher than 95% or 98% or 99%.

In this embodiment, the magnetization direction, i.e. the direction of the magnetic moment, of the layer 42 is parallel and of same sign as the direction X. Typically, the amplitude of the magnetization at saturation of the layer 42 is higher than or equal to 397887 Nm or 795774 Nm or 1432394 A/m.

This magnetization direction is pinned by exchange coupling to the layer 40. In addition, in this particular embodiment, the magnetization direction of the layer 42 of the occurrence $34_1$ is also pinned by exchange coupling to the layer 40 of the occurrence $34_2$ located immediately above. The magnetization direction of the layer 42 of the occurrence $34_N$ is pinned by exchange coupling to the layer 36. Thus, the magnetization direction of each layer 42 is pinned, by exchange coupling, to the antiferromagnetic layers located immediately below and above this layer 42, respectively.

Exchange coupling between a ferromagnetic layer and an antiferromagnetic layer occurs if:
the ferromagnetic layer is deposited directly on the antiferromagnetic layer, or
solely separated from the antiferromagnetic layer by one (or more than one) very thin non-magnetic layer(s) the total thickness of which is smaller than 0.5 nm and, preferably, smaller than 0.4 nm or 0.2 nm.

Thus, in this text, the expressions "a ferromagnetic layer making contact with the antiferromagnetic layer" or "a ferromagnetic sublayer making contact with the antiferromagnetic layer" designate not only the case where the ferromagnetic layer or the ferromagnetic sublayer makes direct mechanical contact with the antiferromagnetic layer but also the case where this layer or this sublayer is solely separated from the antiferromagnetic layer by one or more non-magnetic layers the total thickness of which is smaller than 0.5 nm.

Exchange coupling between ferromagnetic and antiferromagnetic layers is well known. For example, the reader may refer to the following article: J. Nogués and Ivan K. Schuller, "Exchange bias", Journal of Magnetism and Magnetic Materials 192 (199), 203-232.

The presence of exchange coupling between the ferromagnetic layer and the antiferromagnetic layer notably results in a shift, to the left for example, of the hysteresis cycle of the assembly of these two layers and therefore in the appearance of a nonzero field $H_{ex}$.

Here, the thickness of the layers 40 and 42 are chosen to obtain a good exchange coupling between these two layers. In this description, the exchange coupling is considered to be good if the latter results in the appearance of an exchange field $H_{ex}$ the absolute value of which is higher than 50 Oe (3978 Nm) and, preferably, higher than 100 Oe (7957 Nm) or 200 Oe (15915 A/m) or 500 Oe (39788 Nm) at 25° C.

The fields $H_{ex}$ and $H_c$ of a stack solely containing the layers 40 and 42 may be measured experimentally or obtained by numerical simulation.

A good exchange coupling allows, in case of substantial exterior magnetic perturbation, the initial state to be returned to after the disappearance of this perturbation.

The thickness of the layers 40 and 42 is, for example, determined by experiment or by numerical simulation by testing in succession different thicknesses for a stack formed solely from an antiferromagnetic layer and from a ferromagnetic layer that are made from the same materials as layers 40 and 42. For the most commonplace antiferromagnetic and ferromagnetic materials, suitable thicknesses are known to those skilled in the art. For example, typically, the thickness of the layer 40 is comprised between 5 and 100 nm and, preferably, between 5 and 25 nm. The thickness of the layer 42 is often comprised between 5 nm and 100 nm. In this example, the thickness of the layer 40 is preferably comprised between $e_{42}/3$ and $3e_{42}$ in order to obtain a good exchange coupling, where $e_{42}$ is the thickness of the layer 42. Here, the thickness of the layer 40 is 30 nm whereas the thickness of the layer 42 is 20 nm.

The overall magnetic moment of the permanent magnet 20 is proportional to the sum of the magnetic moments of the layers 42 of the stack.

To increase the thermal stability of the magnet 20, the layer 42 comprises stacked immediately on one another in the direction Z:
a sublayer 44 made of a first type of ferromagnetic material,
a sublayer 46 made of a second type of ferromagnetic material, and
a sublayer 48 made of the first type of ferromagnetic material.

Below, the first and second types of ferromagnetic materials are called, "material T1" and "material T2", respectively.

Each of these sublayers 44, 46 and 48 has a thickness larger than 2 nm or 4 nm. The sublayer 46 is deposited directly on the sublayer 44 and the sublayer 48 is deposited directly on the sublayer 46. Preferably, the thickness $e_{46}$ of the sublayer 46 is larger, and preferably 1.1 times or 1.2 times larger, than the thickness $e_{44}$ of the sublayer 44. Likewise, preferably, the thickness $e_{46}$ is larger, and preferably 1.1 times or 1.2 times larger, than the thickness $e_{48}$ of the sublayer 48. Advantageously, the thickness $e_{46}$ is larger than 5 nm and, if possible, larger than $e_{42}/2$, where $e_{42}$ is the total thickness of the layer 42. Advantageously, the thicknesses $e_{44}$ and $e_{48}$ are each smaller than $e_{42}/3$. Here, by way of illustration, the thicknesses $e_{44}$ and $e_{48}$ are equal to 6 nm and the thickness $e_{46}$ is equal to 8 nm.

Here, the sublayers 44 and 48 make contact with the layers 40 of the occurrences 34$_1$ and 34$_2$, respectively.

The material T1 has a strong field $H_{ex}$ but, typically, its field $H_c$ is thermally unstable. More precisely, when the material T1 undergoes a heat treatment, its field $H_c$ increases. In contrast, the material T2 has a thermally stable field $H_c$ but offers a weaker field $H_{ex}$.

Typically, a ferromagnetic material the field $H_c$ of which is thermally unstable is a ferromagnetic material for which the amplitude of its field $H_c$, after having undergone a heat treatment at a high temperature $T_{max}$, is higher than or equal to $1.1H_{cini}$ or $1.3H_{cini}$, where $H_{cini}$ is the value of the amplitude of the coercive field of the same material before undergoing for the first time this heat treatment. $T_{max}$ is set depending on the heat treatments that the magnet 20 will have to undergo. Here, $T_{max}$ is chosen equal to 400° C. Generally, the heat treatment at this high temperature lasts more than one minute and less than one hour. For example, here the heat treatment at the temperature $T_{max}$ lasts 30 min. A ferromagnetic material the field $H_c$ of which is thermally stable is a ferromagnetic material the field $H_c$ of which is not thermally unstable.

Here, the materials T1 and T2 are both alloys of iron and of cobalt. They differ from each other at least in their crystal structure and, optionally in addition, in the proportions of iron and of cobalt. More precisely, it has been observed that the material T1 contains a proportion $P_1$ of face-centered cubic crystals higher than the proportion $P_2$ of face-centered cubic crystals present in the material T2.

The face-centered cubic structure is also referred to using the expression face-centered cubic Bravais lattice and using the acronym fcc (for face-centered cubic). It will be recalled that a face-centered cubic crystal has an atom at each vertex of the cube and an atom at the center of each face of the cube. In the case of face-centered cubic crystals of an alloy of iron and of cobalt, a plurality of structures is possible for these face-centered cubic crystals. For example, the three following structures are possible:

Structure a): the iron atoms occupy the vertices of the cube and the cobalt atoms occupy the center of each of the faces, Structure b): the iron atoms occupy the vertices of the cube and the centers of the horizontal faces of the cube, the cobalt atoms occupy the center of each of the vertical faces of the cube, and Structure c): the cobalt atoms occupy the vertices of the cube and the iron atoms occupy the center of each of the faces.

Here, by "face-centered cubic crystals" of an alloy of iron and of cobalt, what is meant is each and every face-centered cubic crystal irrespective of its structure.

Here, the proportions $P_1$ and $P_2$ are numbers of face-centered cubic crystals per unit area or per unit volume. Typically, the proportion $P_1$ is 1.1 times or 1.3 times higher than the proportion $P_2$.

Face-centered cubic crystals in a sublayer may be identified and counted by observing, by transmission electron microscopy, a section produced through this sublayer. Such an application of transmission electron microscopy is for example described in the following article: S. Groudeva-Zotova et al. Magnetic and structural characteristics of exchange biasing systems based on NiMn antiferromagnetic films, Journal of Magnetism and Magnetic Materials, volume 263, issue 1-2, pp. 57-71 (2003). Transmission electron microscopy is better known by the acronym TEM. Thus, from an observation of a sublayer by transmission electron microscopy, it is possible to estimate the number of face-centered cubic crystals per unit area of this sublayer and therefore the proportion of these face-centered cubic crystals in this sublayer. Other methods may be used to estimate the proportion of face-centered cubic crystals in a ferromagnetic material, such as for example x-ray crystallography, which is better known by the acronym XRD (for x-ray diffraction).

Here, in this first embodiment, the alloy of iron and of cobalt used for the materials T1 and T2 is $Co_{80}Fe_{20}$. The proportions of iron and of cobalt in the materials T1 and T2 are therefore identical. However, they differ from each other in their crystal structure. To this end, for example, the materials T1 and T2 are deposited by sputtering under the same conditions except that the deposition rate V1 of the material T1 is at least five or ten times higher than the deposition rate V2 of the material T2. For example, the deposition rate V2 of the material T2 is higher than 0.3 nm/min or 0.5 nm/min.

In the magnet 20, the first occurrence 34$_1$ is deposited directly on a seed layer 50. The layer 50 may, for example, be a layer made of non-magnetic material that is used to facilitate the deposition, for example by epitaxial growth, of the layer 40. The layer 50 is for example a ruthenium layer of 3 nm thickness. Here, the layer 50 is itself deposited directly on a buffer layer 52. The layer 52 is for example a tantalum layer of 5 nm thickness. The layer 52 is deposited directly on the plinth 30. Other variants are of course possible and notably a single layer may serve both as seed layer and as buffer layer.

Figure 3:
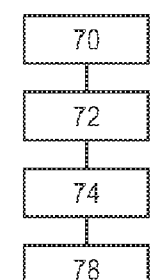
FIG. 3 is a flowchart of a process for manufacturing the permanent magnet of FIG. 2.

FIG. 3 shows a process for manufacturing the permanent magnet 20. More precisely, in a step 70, the various layers and sublayers described with reference to FIG. 2 are deposited on one another. To this end, methods known in the field of microtechnologies and of the production of electronic chips are used. In the step 70, no particular form is given to this stack of layers. This stack covers at least the locations in which the magnets 20 to 22 must be produced.

Here, in step 70, the sublayers 44, 46 and 48 of each ferromagnetic layer 42 are deposited by sputtering. For example, in this embodiment, the sublayers 44, 46 and 48 are deposited by implementing an ion-beam sputtering (IBS) process. Here, the parameters of this ion-beam sputtering process are adjusted to deposit the sublayers 44 and 48 at a rate V1 five or ten times higher than the deposition rate V2 of the sublayer 46. For example, for the deposition of the sublayers 44 and 48, the grid voltage, the beam current and the power of the beam are chosen equal to 1800 V, 261 mA and 470 W, respectively, this allowing a rate V1 of 10 nm of material T1 deposited per minute to be obtained. For the deposition of the sublayer 46, the grid voltage, the beam current and the power of the beam are chosen equal to 600 V, 92 mA and 55 W, respectively, this allowing a rate V2 of 1 nm of material T2 deposited per minute to be obtained.

In a step 72, this stack is structured in order to leave behind only stacks of bar shape in the locations where the magnets 20 to 22 must be produced. Thus, at the end of this step, only bars having the required aspect ratios, i.e. generally higher than 2, 10 or 100, remain.

Next, in a step 74, the bars are heated so that the temperature of the antiferromagnetic layers exceeds their ordering temperature. This anneal is carried out under a saturating magnetic field, as for example described in patent application US 2011/0151589.

Next, as described for example in patent application US 2011/0151589, in a step 78, the bars are cooled under a weaker magnetic field until the exchange coupling between the ferromagnetic and antiferromagnetic layers appears and pins the magnetization directions of each ferromagnetic layer. Permanent magnets 20 to 22 are then obtained.

As regards the other steps of manufacture of the sensor 10, the reader may refer to the patent applications mentioned above in the introduction.

Figure 4:
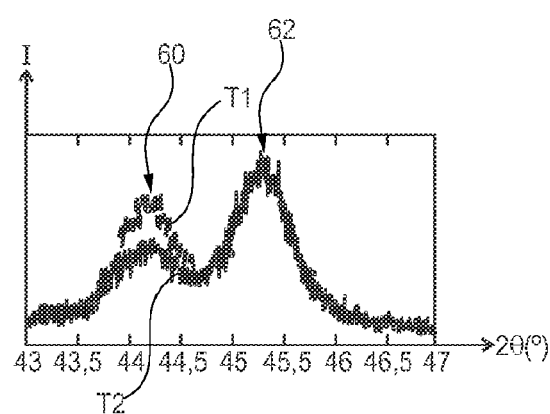
FIG. 4 is an illustration of the x-ray diffraction of first and second types of ferromagnetic materials used in the magnet of FIG. 2.

The graph of FIG. 4 shows the results of an analysis by x-ray crystallography of the materials T1 and T2 when these materials are obtained with different deposition rates such as those employed in the process of FIG. 3. In this graph, the x-axis represents the direction of the diffracted x-rays and the y-axis represents the intensity of the diffracted x-rays. The curves designated by the references T1 and T2 correspond to the materials T1 and T2, respectively. The peaks designated by the references 60 and 62 are characteristic of the presence of face-centered cubic crystals and of body-centered cubic crystals, respectively. The body-centered cubic structure is also referred to using the expression body-centered cubic Bravais lattice and the acronym bcc (for body-centered cubic). The intensities of the peaks 60 and 62 increase as the proportions of face-centered cubic crystals and of body-centered cubic crystals increase, respectively. This analysis by x-ray crystallography therefore confirms that the proportion of face-centered cubic crystals in the material T1 is higher than the proportion of the same crystals in the material T2. In contrast, the graph of FIG. 4 shows that the proportions of body-centered cubic crystals in the materials T1 and T2 are identical. Thus, it is indeed specifically the proportion of face-centered cubic crystals that allows the materials T1 and T2 to be distinguished from each other. This analysis also allowed it to be shown that the proportions $P_1$ and $P_2$ of face-centered cubic crystals per unit area in the materials T1 and T2 are equal to 76.4 and 48.4, respectively, in the particular case of this embodiment. The values 76.4 and 48.4 are expressed in arbitrary units and merely allow the concentrations of face-centered cubic crystals in the materials T1 and T2 to be compared when they are measured under the same conditions with the same apparatus.

Various experiments were carried out to demonstrate the advantage of introducing a sublayer made of material T1 making contact with an antiferromagnetic layer and a sublayer made of material T2 away from the interfaces with the antiferromagnetic layers. More precisely, for three different magnets Nos 1 to 3, the magnetic properties given in the table below were measured before the application for the first time of a heat treatment at 400° C. and after the application of this heat treatment, respectively. The experimental results obtained are summarized in the table below.

| | Before the heat treatment at 400° C. | | | | After the heat treatment at 400° C. | | | |
|---|---|---|---|---|---|---|---|---|
| Magnet No. | $H_{ex}$ (Oe) | $H_c$ (Oe) | $J_{ex}$ (erg/cm²) | Squareness | $H_{ex}$ (Oe) | $H_c$ (Oe) | $J_{ex}$ (erg/cm²) | Squareness |
| 1 | 283 | 52 | 0.41 | 0.9106 | 342 | 72 | 0.49 | 0.8366 |
| 2 | 98 | 25 | 0.14 | 0.9421 | 77 | 23 | 0.11 | 0.8496 |
| 3 | 228 | 46 | 0.33 | 0.9452 | 228 | 46 | 0.33 | 0.9173 |

In the above table, the first column contains the number of the magnet on which the measurements were carried out. The fields $H_{ex}$ and $H_c$ of the table are expressed in oersted (Oe). It will be recalled that 1 Oe=1000/(4π) A·m⁻¹. The quantity $J_{ex}$ designates the amplitude of the exchange coupling. This amplitude is described in terms of interface energy per unit area. This quantity is given by the following relationship: $J_{ex}=M_s e_F H_{ex}$, where:

$J_{ex}$ is expressed in erg/cm² (1 erg/cm²=10⁻³ joule/m²)

$M_s$ is the magnetization at saturation expressed in emu/cm³ (1 emu/cm³=10³ A/m), $e_F$ is the thickness of the ferromagnetic layer expressed in centimeters, $H_{ex}$ is the exchange field expressed in oersted.

Here, each magnet No. 1 to 3 was produced by implementing the process of FIG. 3 with the exception of step 72. Thus, the tested magnets were not structured and therefore were not elongate in a particular direction. To simplify the experimental measurements, each permanent magnet comprised only one occurrence of the pattern 34. In addition, during their manufacture, after step 74, the magnets underwent no heat treatment at above 400° C. before that qualified the first heat treatment in the above table.

Below, for each number of magnet, the composition of each layer/sublayer from the layer 52 to the layer 38 is given. In the lines below, the composition of a layer or a sublayer is separated from the composition of the immediately preceding and following layers in the stack by the symbol "/". The number, which is separated from the composition of the layer or sublayer by a space, expresses the thickness of this layer or sublayer in nanometers. The symbol T1 or T2 between parentheses after the composition of a layer or of a sublayer indicates that it is a question of the material T1 or T2.

Magnet No. 1: Ta 5/Ru 3/$Pt_{50}Mn_{50}$ 30/$Co_{80}Fe_{20}$ (T1) 20/$Pt_{50}Mn_{50}$ 30/Ta 10

Magnet No. 2: Ta 5/Ru 3/$Pt_{50}Mn_{50}$ 30/$Co_{80}Fe_{20}$ (T2) 20/$Pt_{50}Mn_{50}$ 30/Ta 10

Magnet No. 3: Ta 5/Ru 3/$Pt_{50}Mn_{50}$ 30/$Co_{80}Fe_{20}$ (T1) 6/$Co_{80}Fe_{20}$ (T2) 8/$Co_{80}Fe_{20}$ (T1) 6/$Pt_{50}Mn_{50}$ 30/Ta 10.

Figure 5:
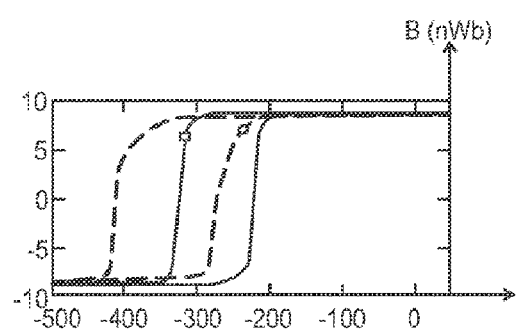
FIGS. 5 and 6 are illustrations of hysteresis cycles of permanent magnets produced using a ferromagnetic layer consisting only of the first or only of the second type of ferromagnetic material described with reference to FIG. 4.
Figure 6:
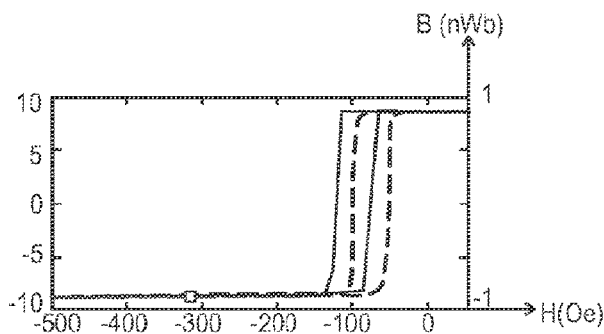
Figure 7:
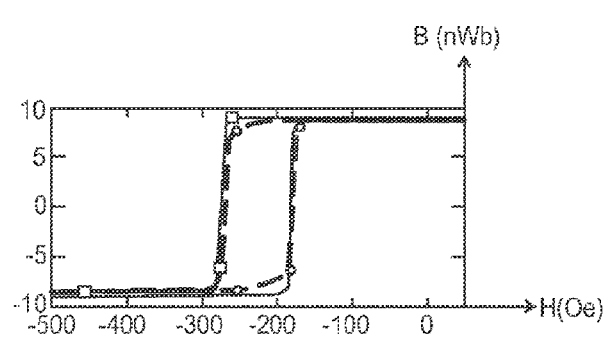
FIG. 7 is an illustration of the hysteresis cycle of a permanent magnet produced using a ferromagnetic layer comprising a sublayer of each of the types of ferromagnetic materials described with reference to FIG. 4.

FIGS. 5 to 7 show, for magnets Nos 1 to 3 respectively, the hysteresis cycles measured before and after the application of the heat treatment. In FIGS. 5 to 7, the solid line represents the hysteresis cycle measured before the application of the first heat treatment at 400° C. The dashed line represents the hysteresis cycle measured after the application of this first heat treatment for a time of 30 minutes. In these figures, the x-axis represents the magnetic field expressed in oersted. The y-axis represents magnetic flux B. It is expressed in nano-weber (nWb). It will be recalled that 1 Wb=1 T·m².

The various measurements indicated in the table were obtained using a measuring apparatus known as a "BH-Looper". Here, it was for example the MESA-200 apparatus sold by SHB Instruments.

As the measurements indicated in the table show, for ferromagnetic and antiferromagnetic materials in identical amounts, the combination in a given ferromagnetic layer of sublayers made of materials T1 and T2 allows the thermal stability of the magnet to be very clearly improved. In particular, in magnet No. 3:
- the field $H_{ex}$ is much less degraded by the heat treatment than in the case where the ferromagnetic layer is solely made of material T2 (magnet No. 2),
- the field $H_c$ is much less degraded by the heat treatment than in the case where the ferromagnetic layer is solely made of material T1 (magnet No. 1), and
- the squareness is much less degraded by the heat treatment than in the case where the ferromagnetic layer is solely made of material T1 (magnet No. 1) or solely made of material T1 (magnet No. 2).

Figure 8:
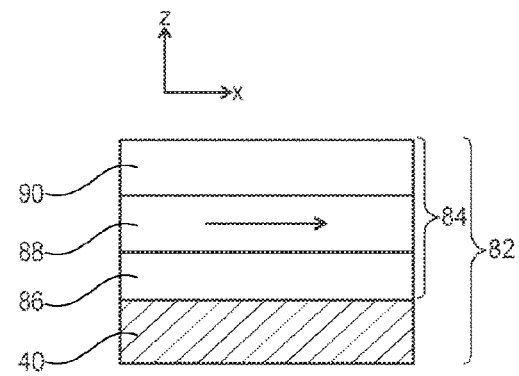
FIGS. 8 to 10 are schematic illustrations, in longitudinal vertical cross section, of other possible embodiments of the patterns of the permanent magnet of FIG. 2.

FIG. 8 shows a pattern 82 able to replace the pattern 34 in the magnet 20. The pattern 82 is identical to the pattern 34 except that the ferromagnetic layer 42 is replaced by a ferromagnetic layer 84. The layer 84 is identical to the layer 42 except that it is produced by stacking on one another three sublayers. More precisely, it comprises, stacked directly on one another in the direction Z:
- a ferromagnetic sublayer 86 made of material T1,
- a ferromagnetic sublayer 88 made of material T2, and
- a ferromagnetic sublayer 90 made of material T1.

What distinguishes the sublayers 86 and 90 from the sublayers 44 and 48 described above is the composition of the material T1. Specifically, in this embodiment, in addition to the fact that the proportion of face-centered cubic crystals is higher in the material T1 than in the material T2, the proportions of iron and of cobalt are not the same in the materials T1 and T2. In this case, typically, the proportion of cobalt in the material T1 is higher than 60% and, preferably, higher than 70% or 80%. The proportion of iron in the material T1 is therefore lower than 40%. For example, here the material T1 is an alloy $Co_{80}Fe_{20}$ or $Co_{90}Fe_{10}$. In contrast, the proportion of cobalt in the material T2 is lower than 50% and, preferably, lower than 40%. The proportion of iron in the material T2 is therefore higher than 50%. Advantageously, with respect to the material T2, the proportion of iron is comprised between 60% and 70% and the proportion of cobalt is comprised between 30% and 40%. For example, here the material T2 is the alloy $Fe_{65}Co_{35}$ deposited as described above to obtain a material T2. It will be noted that in this embodiment, the deposition rate V1 does not need to be at least five times higher than the deposition rate V2 of the material T2. Specifically, the difference in composition of the material T1 is itself enough to ensure that the proportion of face-centered cubic crystals in the material T1 is higher than that in the material T2 even if the rate V1 is not five times higher than the rate V2. For example, the rate V1 may in this case be equal to the rate V2.

Figure 9:
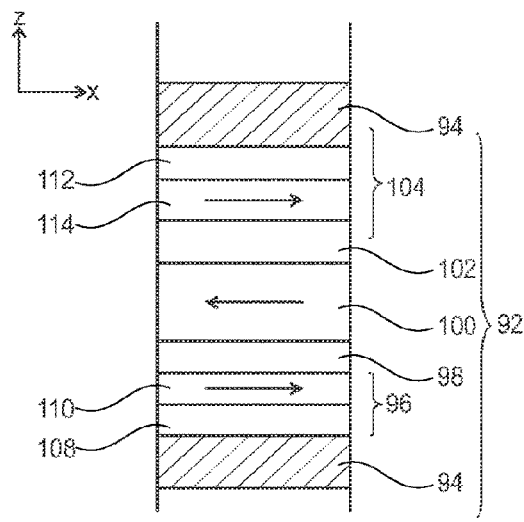

When the magnetization direction of a ferromagnetic layer of a pattern is pinned by exchange coupling to a single antiferromagnetic layer, then, preferably, this ferromagnetic layer solely comprises one sublayer made of material T1, making contact with this antiferromagnetic layer. It is not necessary, or even needless, for this ferromagnetic layer to comprise another sublayer made of material T1, located elsewhere than at the interface with the antiferromagnetic layer. This is illustrated using the pattern 92 of FIG. 9. The pattern 92 is able to replace the pattern 34 in the magnet 20.

The pattern 92 is identical to the pattern 34 described in patent application US2017053724A1 except as regards the structure of the ferromagnetic layers making contact with the antiferromagnetic layers. The structure of the pattern 92 is therefore only briefly recalled here. For more detail, the reader is referred to patent application US2017053724A1. The pattern 92 comprises in succession from bottom to top:
- an antiferromagnetic layer 94,
- a ferromagnetic layer 96 the magnetization direction of which is pinned by exchange coupling to the antiferromagnetic layer 94,
- a non-magnetic layer 98, which is also referred to as a "spacer",
- a ferromagnetic layer 100 the magnetization direction of which is pinned by antiferromagnetic RKKY (Ruderman-Kittel-Kasuya-Yosida) coupling to the ferromagnetic layer 96,
- a non-magnetic layer 102 forming a spacer, and
- a ferromagnetic layer 104 the magnetization direction of which is pinned by exchange coupling to the antiferromagnetic layer 94 of the occurrence of the pattern 92 located just above in the stack of patterns.

The layer 96 solely contains one sublayer 108 made of material T1 and one sublayer 110 made of material T2. The sublayer 108 makes contact with the antiferromagnetic layer 94. The sublayer 110 is deposited directly on the sublayer 108. Correspondingly, the ferromagnetic layer 104 comprises:
- a sublayer 112 made of material T1, making contact with the antiferromagnetic layer located immediately above the ferromagnetic layer 104, and
- a sublayer 114 made of material T2, located on the side opposite to the antiferromagnetic layer that sets the magnetization direction of the layer 104.

In the pattern 90, the materials T1 and T2 are produced, for example, as described in the preceding embodiments.

Figure 10:
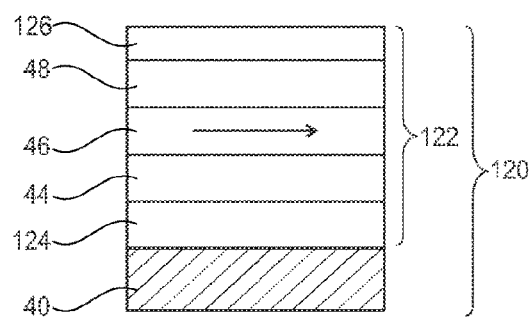

FIG. 10 shows a pattern 120 able to replace the pattern 34 in the magnet 20. The pattern 120 is identical to the pattern 34 except that the ferromagnetic layer 42 is replaced by a ferromagnetic layer 122. The layer 122 is identical to the layer 42 except that it comprises:
- a sublayer 124 interposed between the sublayer 44 and the antiferromagnetic layer 40, and
- a sublayer 126 interposed between the sublayer 48 and the antiferromagnetic layer 40 located immediately above.

The sublayers 124 and 126 are made of NiFe alloy. Preferably, the proportion of nickel in this alloy is higher than 60% and the proportion of iron is lower than 40%. The thicknesses of the sublayers 124 and 126 are smaller than 2 nm and, preferably, smaller than 1 nm. Typically, the thicknesses of the sublayers 124, 126 are larger than 0.5 nm. The presence of these sublayers 124, 126 allows the amplitude of the field $H_{ex}$ to be improved. In this embodiment, the sublayers made of material T1 do not make contact with the antiferromagnetic layers.

SECTION III: VARIANTS

Variants of the Patterns:

Many other embodiments of the ferromagnetic layer are possible. For example, the ferromagnetic layer may comprise a plurality of sublayers made of material T2 stacked directly on one another instead of a single sublayer made of material T2. Similarly, the sublayer made of material T1 may be replaced by a stack directly on one another of a plurality of sublayers made of material T1.

In another variant, additional sublayers of ferromagnetic materials other than the materials T1 and T2 may be introduced into the ferromagnetic layer. For example, it is possible to introduce above the sublayer 110 or between the sublayers 44 and 46 or even between the sublayers 46 and 48, a thin layer made of CoFeB alloy. By thin layer what is meant here is a layer the thickness of which is larger than 1 nm and, generally, larger than 0.5 nm.

The thicknesses of the sublayers made of the materials T1 and T2 may be modified quite substantially without this affecting the improvement in thermal stability obtained. For example, in the case of the pattern 34 or 82, the following thicknesses are also possible:

$e_{44}$=2.5 nm, $e_{46}$=15 nm, $e_{48}$=2.5 nm,
$e_{44}$=5 nm, $e_{46}$=10 nm, $e_{48}$=5 nm, or
$e_{44}$=7.5 nm, $e_{46}$=5 nm, $e_{48}$=7.5 nm.

As a variant, in all the embodiments, the CoFe alloy used to produce the material T1 may be replaced by an NiFe alloy. Preferably, the NiFe alloy used contains a proportion of nickel higher than 60% and a proportion of iron lower than 40%.

The antiferromagnetic layer 40 may also be formed from a stack of a plurality of antiferromagnetic sublayers. For example, the antiferromagnetic layer is formed from a sublayer made of IrMn deposited directly on a sublayer made of PtMn.

The antiferromagnetic layer 36 deposited on the ferromagnetic layer of the last pattern of the stack may be omitted. In this case, preferably, the thickness of the layer 42 of this last pattern is small with respect to the thickness of the layer 42 of the other patterns of the same stack.

Variants of the Stack:

Other structures are possible for the pattern. For example, the teaching given in this patent application applies to the various patterns described in FIGS. 6 to 8 of patent application US2017053724A1.

It is also possible to combine, in the same stack, different patterns. For example, it is possible to construct a stack by alternating the patterns 34 and 82 or the patterns 34 and 92 or the patterns 84 and 122, inter alia.

In one simplified embodiment, the ferromagnetic layer comprising the sublayers made of materials T1 and T2 is solely introduced into only one portion of the patterns of the stack. Thus, at least one pattern, and preferably at least 40% or 50% or 80% of the patterns of this stack, comprise such a ferromagnetic layer.

Similarly, the antiferromagnetic material used to form the layer 40 of a pattern may be different from one pattern to the next. For example, in one pattern, this antiferromagnetic material is IrMn and in another pattern it is a question of PtMn.

The buffer layer 52 may be omitted.

The order of the antiferromagnetic and ferromagnetic layers inside the patterns may be inverted. In this case, the ferromagnetic layer is located under the antiferromagnetic layer.

Other Variants:

There are other sputtering deposition processes capable of being used instead of deposition by ion-beam sputtering. For example, deposition by magnetron cathode sputtering or deposition by triode cathode sputtering (TCS) or other cathode sputtering methods may be employed. Whatever the sputtering process used, the ratio between the deposition rates of the materials T1 and T2 are adjusted as described above, if necessary, to obtain the materials T1 and T2.

The stack does not necessarily have a parallelepipedal shape. For example, the cross section of the stack parallel to the directions X, Y is an ellipse or an oval. In the latter cases, the aspect ratio of the permanent magnet is defined as being the ratio of the length to the width of the parallelepiped of smallest volume entirely containing the stack.

As a variant, the aspect ratio of the stack is not necessarily higher than or equal to two. For example, it may be equal to one.

SECTION IV: ADVANTAGES OF THE EMBODIMENTS

The use of sublayers made of materials T1 and T2 allows the thermal stability of the permanent magnet to be increased notably with respect to heat treatments at high temperature.

The use of sublayers made of materials T1 and T2 in which the proportions of iron and of cobalt are identical simplifies the manufacture of the ferromagnetic layer.

The fact that the proportion of iron and of cobalt may be varied to obtain the materials T1 and T2 makes it possible to not have to adjust the deposition rate to obtain these two types of materials.

Repeating the pattern at least twice in the stacking direction allows a strong magnetic field to be obtained.

Using deposition rate to obtain the sublayers made of materials T1 and T2 simplifies the manufacture of the permanent magnet.

The invention claimed is:

1. A permanent magnet comprising:
an antiferromagnetic layer,
a ferromagnetic layer having a magnetization direction set by exchange coupling to the antiferromagnetic layer, the ferromagnetic layer comprising:
a first sublayer making contact with the antiferromagnetic layer or solely separated from the antiferromagnetic layer by an intermediate ferromagnetic sublayer the thickness of which is smaller than 2 nm, the thickness of this first sublayer being larger than 2 nm, this first sublayer being made of a first type of ferromagnetic material, the first type of ferromagnetic material being an alloy of iron and cobalt that is at least partially crystallized, and
a second sublayer separated from the antiferromagnetic layer by the first sublayer, the thickness of this second sublayer being larger than 2 nm, this second sublayer being made of a second type of ferromagnetic material, wherein the second type of ferromagnetic material is also an alloy of iron and cobalt in which a proportion of face-centered cubic crystals is lower than a proportion of face-centered cubic crystals in the first type of ferromagnetic material.

2. The permanent magnet of claim 1, wherein:
the proportion, in atomic percent, of iron in the first type of material is equal to the proportion, in atomic percent, of iron in the second type of material, and
the proportion, in atomic percent, of cobalt in the first type of material is equal to the proportion, in atomic percent, of cobalt in the second type of material.

3. The permanent magnet of claim 2, wherein:
the first sublayer is obtained using a sputtering deposition process, and
the second sublayer is obtained using the same sputtering deposition process but has a deposition rate for the second sublayer that is at least five times lower than a deposition rate of the first sublayer.

4. The permanent magnet of claim 1, wherein:
in the first type of material, the proportions, in atomic percent, of iron and of cobalt are lower than 40% and higher than 60%, respectively, and
in the second type of material, the proportions, in atomic percent, of iron and of cobalt are higher than 50% and lower than 50%, respectively.

5. The permanent magnet of claim 1, wherein the proportions, in atomic percent, of iron and of cobalt in the second type of material are equal to x% and y%, respectively, where x is between 60 and 70, and y is between 30 and 40.

6. A stacked permanent magnet, comprising:
a stack of N patterns stacked immediately on one another in a stacking direction, where N is an integer greater than or equal to 2, each pattern comprising:
the permanent magnet of claim 1,
wherein the antiferromagnetic layer of each permanent magnet is made of an antiferromagnetic material,
wherein the ferromagnetic layer of each permanent magnet is made of a ferromagnetic material, and
wherein the magnetization directions of the ferromagnetic layers are all identical.

7. The stacked permanent magnet of claim 6, wherein:
the magnetization direction of each ferromagnetic layer of N-1 patterns is set by an exchange coupling to an antiferromagnetic layer of a pattern immediately adjacent in the stack,
each ferromagnetic layer in each of these N-1 patterns further comprises a third sublayer,
the third sublayer is in contact with the antiferromagnetic layer of the adjacent pattern or the third sublayer is solely separated from the antiferromagnetic layer of the adjacent pattern by an additional intermediate sublayer made of a ferromagnetic material having a thickness smaller than 2 nm,
the second sublayer is interposed between the first and third sublayers,
the thickness of the third sublayer is larger than 2 nm, and
the third sublayer is made of the first type of ferromagnetic material.

8. The stacked permanent magnet of claim 6, wherein N is an integer greater than or equal to five.

9. The permanent magnet of claim 1, wherein the proportion of face-centered cubic crystals in the first type of ferromagnetic material is 1.1 times greater than the proportion of face-centered cubic crystals in the second type of ferromagnetic material.

10. The permanent magnet of claim 1,
wherein the intermediate ferromagnetic sublayer is present, and
wherein a thickness of the intermediate ferromagnetic sublayer is smaller than 1 nm.

11. A magnetic-field sensor comprising:
a planar substrate,
at least one permanent magnet of claim 1, which is movable with respect to the planar substrate in response to a variation in the amplitude or in the direction of a magnetic field to be measured, and
a transducer fastened to the planar substrate, which is able to convert a movement of the at least one permanent magnet into an electrical quantity representative of the amplitude or of the direction of the magnetic field to be measured.

12. A process for manufacturing the permanent magnet of claim 1, the process comprising:
forming a stack, the stack comprising, stacked on one another in a stacking direction:
the antiferromagnetic layer, and
the ferromagnetic layer.

13. The process of claim 12, wherein the step of forming the stack comprises:
depositing the first sublayer using a sputtering deposition process, and
depositing the second sublayer using the same sputtering deposition process but having a deposition rate for the second sublayer that is at least five times lower than a deposition rate of the first sublayer.

* * * * *